United States Patent [19]

Kuroda et al.

[11] 4,363,005
[45] Dec. 7, 1982

[54] POWER CONSERVING BLOCKING OSCILLATOR POWER SUPPLY CIRCUIT

[75] Inventors: Toshihiko Kuroda, Tokyo; Kazuo Sugiyama, Mitaka, both of Japan

[73] Assignee: Dentan Kabushiki Kaisha, Tokyo, Japan

[21] Appl. No.: 243,941

[22] PCT Filed: Jul. 3, 1979

[86] PCT No.: PCT/JP79/00176

§ 371 Date: Feb. 27, 1981

§ 102(e) Date: Feb. 27, 1981

[87] PCT Pub. No.: WO81/00178

PCT Pub. Date: Jan. 22, 1981

[51] Int. Cl.³ ............... H03K 3/30; H02M 3/335; G05F 1/64
[52] U.S. Cl. .................................. 331/112; 363/19
[58] Field of Search ............... 331/112, 146, 148; 363/18, 19

[56] References Cited

U.S. PATENT DOCUMENTS 3,132,309 5/1964 Constable .............. 331/112 X
3,849,716 11/1974 De Bergh et al. ............ 363/19
3,928,793 12/1975 Waltz .................... 331/112 X

FOREIGN PATENT DOCUMENTS 52-71655  6/1977 Japan.
52-138344 10/1977 Japan.
53-33346  3/1978 Japan.

Primary Examiner—Siegfried H. Grimm

[57] ABSTRACT

A power source circuit for a discharge type sensing circuit, comprising a blocking oscillator (1) and a feedback circuit (2) for changing the period of oscillation of the blocking oscillator (1). The sensing circuit as a load is connected to a secondary winding ($L_2$) of a transformer (T) of the blocking oscillator (1). The base bias of a transistor ($Tr_1$) of the blocking oscillator is controlled by the feedback circuit (2) to which is applied a negative voltage produced in the primary winding ($L_1$) in an off state of the transistor ($Tr_1$). As a result, when the sensing circuit is in the sensing mode of operation, the period of oscillation becomes shorter for rapid supply of electric power and, when in the waiting mode of operation, the period of oscillation becomes longer for reducing supply of power, so that the power consumption is reduced as a whole.

2 Claims, 5 Drawing Figures

POWER CONSERVING BLOCKING OSCILLATOR POWER SUPPLY CIRCUIT

FIELD OF THE ART

The present invention relates to a voltage stabilizing circuit of a power source for use with discharge type sensor or such.

BACKGROUND OF THE ART

Power sources for sensors such as Geiger counter tube and ultraviolet sensing tube, using discharge tubes as their sensing elements, have commonly used supply voltages slightly lower than respective self-discharge voltages of the discharge tubes.

In general, the power source to be used for a sensor has to supply a stable operating voltage to the sensing circuit to thus keep this functionable at all times during the sensing mode of operation and waiting mode of operation for obtaining a reliable operation. Accordingly, the sensor consumes a certain amount of electric power even in the waiting mode, wherein no sensing mode occurs, to hold ready for the sensing. The sensor of discharge type has a performance characteristic such that it consumes a large amount of electric power in the sensing mode only, stores rapidly electric power for discharge concurrently with the sensing mode in order to provide for the next sensing mode, and consumes an extremely small amount of electric power in the waiting mode. Therefore, the power source to be used for a discharge type sensor is needed to be designed so as to rapidly supply a large amount of electric power only in the time of discharge in the sensing mode and supply no more than such amount of power that is consumed as a loss in the waiting mode i.e., to reduce the power consumption as a whole, with a stable voltage being supplied to the sensor, thereby enabling the sensor to operate effectively and reliably over a long period of time.

DISCLOSURE OF THE INVENTION

The inventors have accomplished the present invention to develop a power source which can effectively meet the requirements necessary for power sources to be used for discharge type sensors.

An object of the present invention is to provide a power source voltage stabilizing circuit wherein a base of an oscillatory transistor of a blocking-oscillatory circuit is connected through a resistor to a drain of a control transistor, a circuit is provided between a primary winding of a transformer of the blocking oscillatory circuit and a gate of the control transistor for applying a voltage at a terminal of the primary winding of the transformer to the gate of the control transistor, the transformer has a secondary winding connectable to a discharge type sensing circuit, and a base current of the oscillatory transistor is controlled with the control transistor to change the period of oscillation of the blocking-oscillatory circuit.

According to the present invention, when a starting switch is closed or the sensing circuit is performing a sensing mode of operation, the control transistor is substantially on, shortening the period of oscillation of the blocking-oscillatory circuit for rapid supply of electric power for discharge. When the sensing circuit is performing a waiting mode of operation, in which no sensing mode occurs, the control transistor remains substantially off, prolonging the period of oscillation of the blocking-oscillatory circuit for reducing the supply of electric power. The present invention is therefore advantageous in that the power consumption can be reduced as a whole and a stable power source voltage can be applied in accordance with performance characteristics of the sensing circuit.

Moreover, according to the present invention, the sensing circuit is able to work stably and reliably over an extremely long period of time with a commercially available small-sized dry cell because of the possible remarkable reduction of power consumption.

A preferred embodiment of the present invention will be described in detail hereinbelow with reference to the accompanying drawings, wherewith a concrete structure and advantages of the invention will be further understood.

BEST MODE FOR CARRYING OUT THE INVENTION

Figure 1:
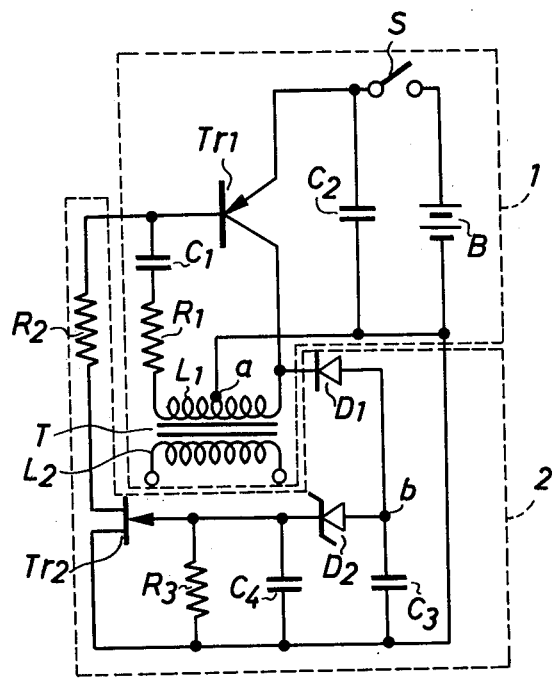
FIG. 1 is a circuit diagram showing an embodiment of a power source voltage stabilizing circuit according to the present invention.
Figure 5:
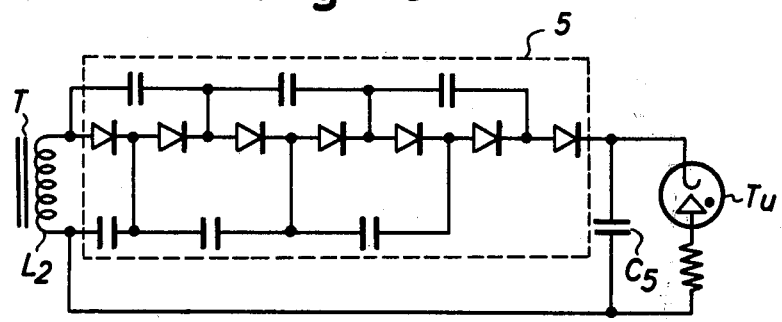
FIG. 5 is a circuit diagram of an embodiment of a sensing circuit.

FIG. 1 briefly illustrates a power source voltage stabilizing circuit, which is connectable to an ultraviolet sensor circuit as shown in FIG. 5 for supplying a stable power source voltage thereto.

The structure and operation of the voltage stabilizing circuit will be described.

In FIG. 1, the circuitry 1 is a blocking-oscillatory circuit comprising a transformer T, a transistor $Tr_1$, condensors $C_1$, $C_2$, and a resistor $R_1$. The transistor $Tr_1$ has a collector and a base between which a primary winding $L_1$ of the transformer T, the resistor $R_1$, and the condenser $C_1$ are connected in series. The condenser $C_2$ and a power source cell B are connected in parallel between a center tap a of the primary winding $L_1$ and an emitter of the transistor $Tr_1$, and a switch S is interposed between the condenser $C_2$ and a positive terminal of the cell B. The base of the transistor $Tr_1$ is connected via a resistor $R_2$ to a drain of a field effect transistor $Tr_2$ as described later on.

The transformer T has a secondary winding $L_2$ to be connected to the ultraviolet sensing circuit.

The circuitry 2 in FIG. 1 is a feedback circuit for controlling the period of oscillation of the blocking-oscillatory circuit, comprising a diode $D_1$, a Zener diode $D_2$, condensers $C_3$, $C_4$, resistors $R_2$, $R_3$, and the transistor $Tr_2$. The diode $D_1$ is connected to the collector of the transistor $Tr_1$, and between a terminal b of the diode $D_1$ and a gate of the transistor $Tr_2$ there is provided a four-terminal circuit wherein the resistor $R_3$ and condensers $C_3$, $C_4$ are connected in parallel with their lower terminals jointed to a negative terminal of the cell B and the Zener diode $D_2$ interposed between the upper terminals of the condensers $C_3$, $C_4$, thereby applying a voltage of the primary winding of the transformer T to the gate of the transistor $Tr_2$. The transistor $Tr_2$ is a field effect transistor, which controls a bias current to be conducted to the base of the transistor $Tr_1$ dependent on the level of the voltage applied to the gate of the transistor $Tr_2$.

Figure 2:
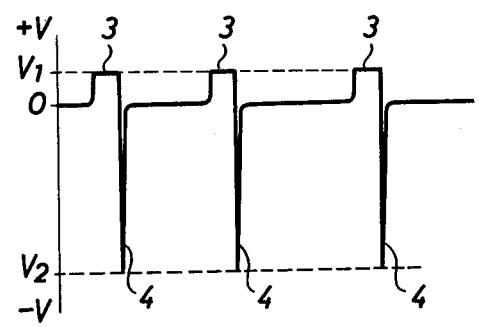
FIG. 2 is an illustrative chart of voltage characteristics at a primary winding of a transformer.

In the above-mentioned circuit diagram, when the switch S is turned on, the blocking-oscillatory circuit 1 starts oscillating. With the oscillation having entered into a stationary state, there appears an oscillating voltage at the center tap a or at the collector of the transistor $Tr_1$, such as shown in FIG. 2. The portion 3 of the voltage curve in FIG. 2, denotes a state wherein, with the condenser $C_1$ charged to a predetermined voltage, a base current is conducted for causing the transistor $Tr_1$ to operate, whereupon a voltage Vcc in the form of a square wave is applied to the primary winding of the transformer T. The portion 4 of the voltage curve denotes a state wherein, with the condenser $C_1$ having discharged, the base current has disappeared for urging the transistor $Tr_1$ into an off state, whereupon a large negative voltage is generated across the primary winding of the transformer T. Such voltage variations repeatedly appear at the center tap a of the transformer T at the period of oscillation of the oscillatory circuit 1.

Concurrently with the above-mentioned action of the oscillatory circuit 1, in the state of the afore-said voltage characteristic 4, the condenser $C_3$ in the feedback circuit 2 is charged through the diode $D_1$. The voltage across the terminals of condenser $C_3$ becomes increasingly negative with time until it reaches a Zener voltage of the Zener diode $D_2$, whereby the Zener diode $D_2$ becomes conductive charging the condenser $C_4$. When the condenser $C_4$ is charged up to a preset negative voltage, which is applied to the gate of the transistor $Tr_2$, it renders the transistor $Tr_2$ cut off. A current running through the resistor $R_2$ and transistor $Tr_2$ is accordingly reduced, so that the base current of the transistor $Tr_1$ increases, prolonging the period of oscillation of the transistor $Tr_1$ to a certain value.

With the feedback circuit 2 functioning as above, the period of oscillation of the oscillatory circuit 1 is prolonged, reducing the power consumption as a whole and stabilizing the output voltage to maintain the waiting mode.

Figure 3:
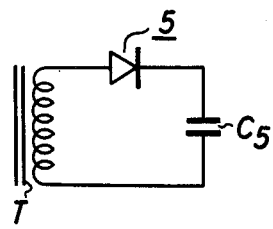
FIG. 3 is a principle circuit diagram of a circuit for storing electric power for discharge.

The output terminals of the secondary winding $L_2$ of the transformer T of the voltage stabilizing circuit thus described are connected to the input terminals of the sensing circuit as illustrated in FIG. 5. The sensing circuit comprises a rectifying circuitry 5, a condenser $C_5$ for producing discharge current, and a sensing tube Tu. In the sensing circuit, the alternating output voltage across the secondary winding of the transformer T is rectified by the rectifying circuitry 5, in which the voltage is increased through a group of cascaded condensers up to several hundred volts so as to charge the condenser $C_5$. When considering the charging process only, the sensing circuit can be reduced basically to the circuit shown in FIG. 3. The sensing tube Tu may, for example, be an ultraviolet sensing tube which, upon reception of ultraviolet radiation, discharges with a discharge current supplied from the condenser $C_5$.

During the sensing mode of the ultraviolet sensing circuit, the voltage stabilizing circuit functions as follows:

When the switch S of the voltage stabilizing circuit is turned on, the blocking-oscillatory circuit 1 and feedback circuit 2 start working. At first with the transistor $Tr_2$ being on, oscillation is rendered rapid, thus rapidly charging the condenser $C_5$ up to a predetermined voltage. The whole circuit thereby enters into the waiting mode. In this state, the oscillatory circuit 1 is controlled for pulsed oscillation of a long period with the feedback circuit 2 which renders the transistor $Tr_2$ off, so as to supply only such amount of electric power as is required to compensate for leaked power of the whole circuit.

Figure 4:
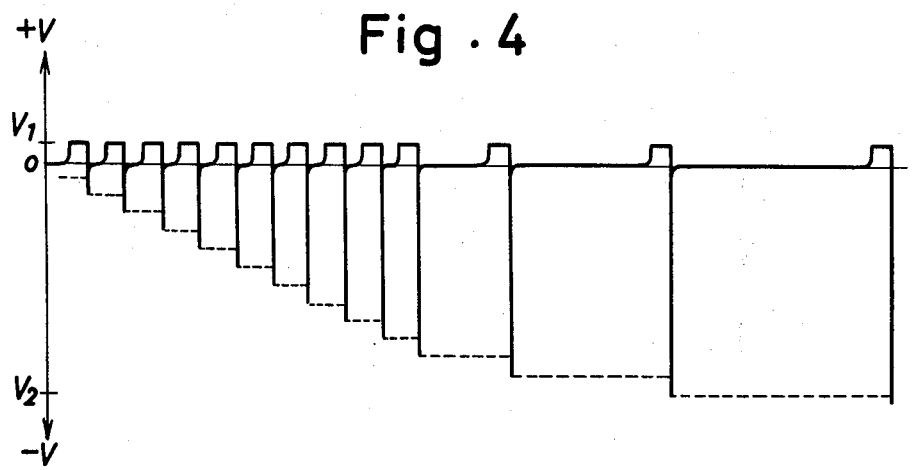
FIG. 4 is an illustrative chart of voltage characteristics at the primary winding of the transformer in a sensing mode of operation.

If the ultraviolet sensing tube Tu catches ultraviolet rays, starting discharge, the condenser $C_5$ conducts discharge current, reducing the voltage across the terminals. At this time, the condenser $C_5$ is now charged by the rectifying circuit 5, therefore the voltage across terminals of the transformer T rapidly becomes low. Accordingly, with the charging of the condenser $C_3$ being reduced, the voltage at the point b drops below the Zener voltage, whereby the condenser $C_4$ discharges through the resistor $R_3$ reducing the voltage across the terminals to a potential level of substantially zero and turning on the transistor $Tr_2$. As the transistor $Tr_2$ stays on, the base of the transistor $Tr_1$ is biased with the transistor $Tr_2$ and the resistor $R_3$. Hence, the period of oscillation of the transistor $Tr_1$ rapidly becomes short as shown in the first half of the chart of FIG. 4, thus hurrying the oscillation and progressively enlarging the negative amplitude, so that the condenser $C_3$ is rapidly charged with the voltage increasing across its terminals. When the point b reaches the Zener voltage, the Zener diode $D_2$ becomes conductive, charging the condenser $C_4$ with a negative voltage, whereby the transistor $Tr_2$ is rendered off to prolong the period of oscillation of the oscillatory circuit for establishing the waiting mode as described hereinbefore.

As understood from the foregoing, the oscillatory transistor $Tr_1$ of the blocking-oscillatory circuit 1 has the base bias DC-controlled by an on-off action of the transistor $Tr_2$ in the feedback circuit 2 . As a consequence, when the switch S is turned on or the sensing tube Tu is in the sensing mode, the period of oscillation becomes short for rapid supply of the electric power for discharge. In the waiting mode, wherein no sensing mode occurs, the period of oscillation is prolonged to possibly minimize electric power supply to the whole circuit, thus reducing the power consumption. A stable output voltage can thus be suplied to the sensor in both the sensing mode and waiting mode.

A voltage stabilizing circuit according to the present invention, in addition to that it itself can work with small electric power, can effectively supply electric power for use in the operation of a sensor and enables the use of a commercially available dry cell for stable operation of a sensor over a long period of time.

INDUSTRIAL APPLICABILITY

The present invention is applicable to a power source circuit for a sensor using a discharge tube as the sensing element, and relies on a pulsed oscillation, which period is variable dependent on the mode of operation of the circuit. Therefore, the power consumption is extremely reduced as a whole and the applied voltage can be kept stable. For this reason, with a small-size dry cell, it is possible to use the power source voltage stabilizing circuit for variable alarm devices of long-life discharge type.

We claim:

1. A power source voltage stabilizing circuit, characterized in that a base of an oscillatory transistor of a blocking-oscillatory circuit is connected through a resistor to a drain of a control transistor, a circuit is provided between a primary winding of a transformer of said blocking-oscillatory circuit and a gate of said control transistor for applying a voltage at a terminal of said primary winding of said transformer to said gate of said control transistor, said transformer has a secondary winding connectable to a discharge type sensing circuit, and a base current of said oscillatory transistor is controlled with said control transistor to change the period of oscillation of said blocking-oscillatory circuit.

2. A power source voltage stabilizing circuit according to claim 1, characterized in that, in said circuit for applying said voltage at said terminal of said primary winding of said transformer to said gate of said control transistor, two condensers and a resistor are connected in parallel with one terminal of each being grounded, a Zener diode is interposed between the other terminals of said two condensers, and a terminal of said Zener diode is connected through a diode to said primary winding of said transformer.

* * * * *